(12) United States Patent
Pai et al.

(10) Patent No.: US 9,455,716 B2
(45) Date of Patent: Sep. 27, 2016

(54) RECONFIGURABLE FRACTIONAL DIVIDER

(71) Applicant: QUALCOMM Incorporated, San Diego, CA (US)

(72) Inventors: Hung-Chuan Pai, Irvine, CA (US); Gang Zhang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 141 days.

(21) Appl. No.: 14/488,248

(22) Filed: Sep. 16, 2014

(65) Prior Publication Data

US 2015/0349782 A1 Dec. 3, 2015

Related U.S. Application Data

(60) Provisional application No. 62/004,095, filed on May 28, 2014.

(51) Int. Cl.
| | |
|---|---|
| H03K 21/02 | (2006.01) |
| H04B 1/40 | (2015.01) |
| H03K 5/133 | (2014.01) |
| H03L 7/081 | (2006.01) |
| H03L 7/16 | (2006.01) |
| H03K 23/66 | (2006.01) |
| H03K 5/00 | (2006.01) |
| H03K 5/13 | (2014.01) |

(52) U.S. Cl.
CPC ............ *H03K 21/02* (2013.01); *H03K 23/667* (2013.01); *H03L 7/081* (2013.01); *H03L 7/16* (2013.01); *H04B 1/40* (2013.01); *H03K 5/00006* (2013.01); *H03K 5/133* (2013.01)

(58) Field of Classification Search
CPC .. H03K 21/00; H03K 21/02; H03K 5/00006; H03K 5/133; H03L 7/00; H03L 7/081; H03L 7/16; H04B 1/00; H04B 1/40

USPC .......................................................... 327/117
See application file for complete search history.

(56) References Cited

U.S. PATENT DOCUMENTS

| | | | |
|---|---|---|---|
| 6,476,692 B2 | 11/2002 | Uchino | |
| 6,882,229 B1 | 4/2005 | Ho et al. | |
| 7,825,703 B2 | 11/2010 | Qiao et al. | |
| 7,869,769 B2 | 1/2011 | Stengel et al. | |
| 8,368,434 B2 | 2/2013 | Tasic et al. | |
| 2002/0097075 A1 | 7/2002 | Ono et al. | |
| 2005/0184781 A1* | 8/2005 | Nagasue | H03K 5/00006 327/175 |
| 2008/0056337 A1* | 3/2008 | Tal | H03B 21/02 375/219 |
| 2011/0200161 A1* | 8/2011 | Tasic | H03K 21/08 377/48 |

OTHER PUBLICATIONS

International Search Report and Written Opinion—PCT/US2015/030883—ISA/EPO—Oct. 5, 2015.

\* cited by examiner

*Primary Examiner* — John Poos
*Assistant Examiner* — David Mattison
(74) *Attorney, Agent, or Firm* — Arent Fox LLP

(57) ABSTRACT

Aspects of a reconfigurable frequency divider circuit are provided. A reconfigurable frequency divider can include a frequency divider that is configured to receive an input signal. The frequency divider can also include a delay circuit that is configured to receive a divided signal produced by the frequency divider. The frequency divider can also include a frequency multiplier that is configured to produce an output signal based on the delayed signal produced by the delay circuit, wherein the delay circuit is configured to receive the output signal.

20 Claims, 9 Drawing Sheets

RECONFIGURABLE FRACTIONAL DIVIDER

CROSS-REFERENCE TO RELATED APPLICATION

This application claims the benefit of U.S. Provisional Application Ser. No. 62/004,095, entitled, "Reconfigurable Fractional Divider" and filed on May 28, 2014, which is expressly incorporated by reference herein in its entirety.

TECHNICAL FIELD

Various exemplary embodiments disclosed herein relate generally to electronic circuits. In particular, various embodiments relate to logical circuits for frequency signals.

BACKGROUND

Various electronic devices use oscillators, such as voltage-controlled oscillators (VCOs) to generate desired frequencies for various circuits. For example, wireless devices can employ VCOs to generate target frequencies that are used to modulate data for transmission and reception over specified carrier waves.

In some instances, wireless devices use one or more frequency dividers to modify an input frequency signal, such as a high-frequency clock signal generated by a crystal oscillator, to the target frequency. Devices can cascade various logical divider circuits in order to use a desired divisor to produce an output signal at a specified frequency. Some logical blocks, such as a divide-by-3 circuit, internally include a feedback loop that helps stabilize output signals. However, some logical circuits, such as a doubler (×2 multiplier) are constructed without internal feedback. When used in conjunction to produce a "divide by 1.5" circuit, the doubler may not be included in a feedback loop with the other logical components. Use of the doubler outside of the feedback loop of other components in the logical circuit can lead to unwanted variations in the output signal, as variations in the doubler can directly affect the output signal.

In view of the foregoing, it would be desirable to use a stable frequency divider. In particular, it would be desirable to use divider and multiplier circuits that receive feedback to stabilize output signals.

SUMMARY

In light of the present need for an improved frequency divider circuit, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

Aspects of a reconfigurable frequency divider circuit are provided. A reconfigurable frequency divider can include a frequency divider that is configured to receive an input signal. The frequency divider can also include a delay circuit that is configured to receive a divided signal produced by the frequency divider. The frequency divider can also include a frequency multiplier that is configured to produce an output signal based on the delayed signal produced by the delay circuit, wherein the delay circuit is configured to receive the output signal.

It should be apparent that, in this manner, various exemplary embodiments enable an improved frequency divider circuit. Particularly, by incorporating a multiplier circuit into a feedback loop of the divider circuit, the frequency divider circuit can stabilize output signals. Further, use of a control circuit and adjustable capacitors can increase the frequency tuning range of the frequency synthesizer that uses the frequency divider circuit.

BRIEF DESCRIPTION OF THE DRAWINGS

In order to better understand various exemplary embodiments, reference is made to the accompanying drawings wherein.

DETAILED DESCRIPTION

Figure 1:
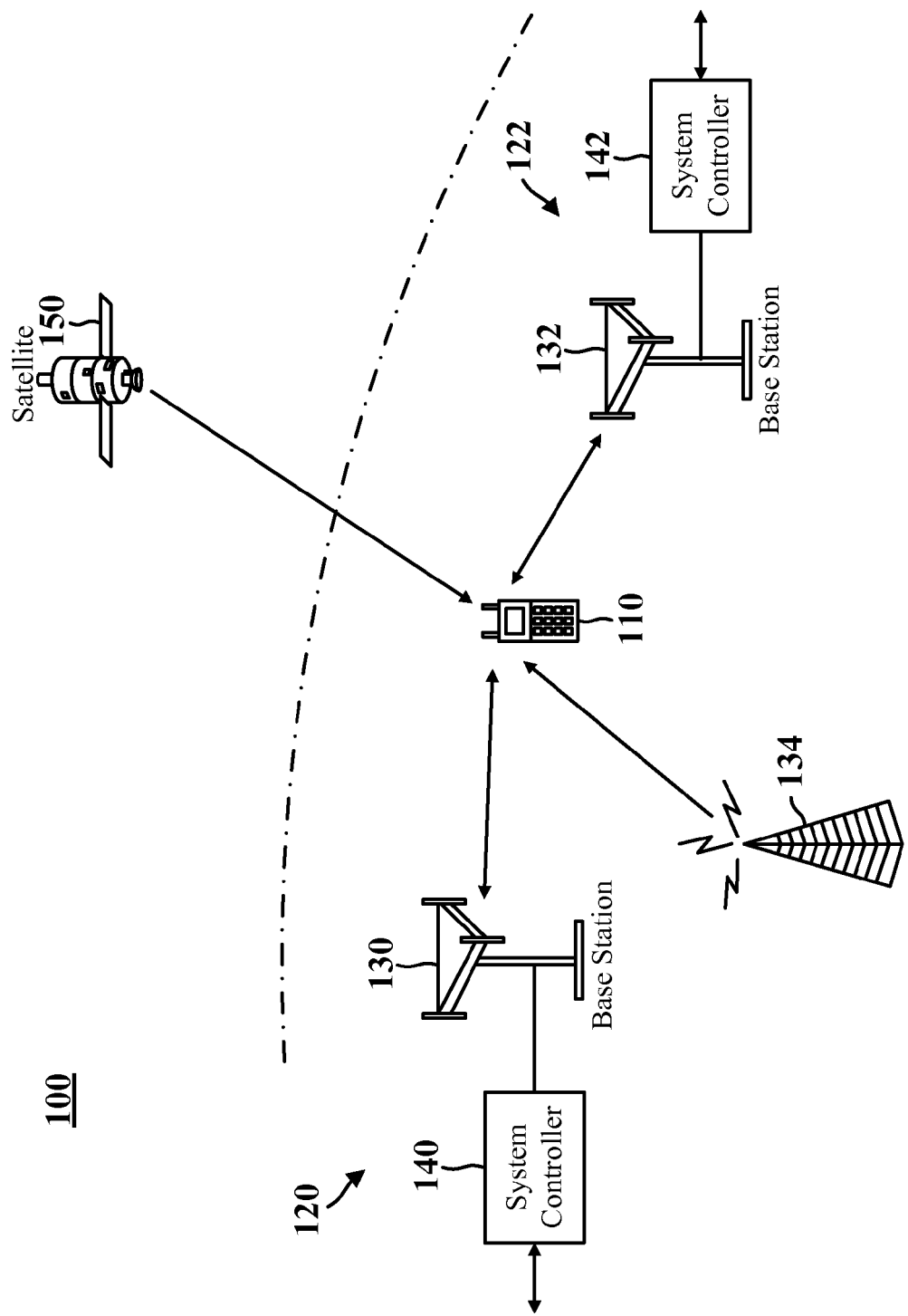
FIG. 1 illustrates a wireless device communicating with wireless communications systems.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, circuit or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the terms "comprises", "comprising,", "includes" and/or "including", when used herein, specify the presence of the stated features, integers, steps, operations, elements, and/or components, but do not preclude the presence or addition of one or more other features, integers, steps, operations, elements, components, and/or groups thereof.

Various aspects of circuits for an optimized reconfigurable frequency divider will now be presented. However, as those skilled in the art will readily appreciate, such aspects may be extended to other circuit configurations and devices. Accordingly, all references to a specific application for frequency divider arrangements, or any component, structure, feature, functionality, or process within a synchronized wireless device are intended only to illustrate exemplary aspects of electronic hardware with the understanding that such aspects may have a wide differential of applications.

Various embodiments of hardware with an installed frequency divider may be used, such as a mobile phone, personal digital assistant (PDA), desktop computer, laptop computer, palm-sized computer, tablet computer, set-top box, navigation device, work station, game console, media player, or any other suitable device.

FIG. 1 illustrates a wireless device communicating with different wireless communications systems. FIG. 1 is a diagram 100 illustrating a wireless device 110 communicating with different wireless communication systems 120, 122. Wireless device 110 can use a frequency divider for communication via carrier waves at specified frequencies; other uses of frequency synthesizers and frequency dividers are known to those of skill in the art. Wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1× or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, wireless system 120 may be a GSM system, and the wireless system 122 may be a WCDMA system. As another example, the wireless system 120 may be an LTE system, and wireless system 122 may be a CDMA system.

For simplicity, diagram 100 shows wireless system 120 including one base station 130 and one system controller 140, and wireless system 122 including one base station 132 and one system controller 142. In general, each wireless system 120, 122 may include any number of base stations and any set of network entities. Each base station 130, 132 may support communication for wireless devices within the coverage of the base station. Base stations 130, 132 may also be referred to as a Node B, an evolved Node B (eNB), an access point, a base transceiver station, a radio base station, a radio transceiver, a transceiver function, a basic service set (BSS), an extended service set (ESS), or some other suitable terminology. Wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

Wireless device 110 may be capable of communicating with wireless system 120 and/or 122. Wireless device 110 may also be capable of receiving signals from broadcast stations, such as broadcast station 134. Wireless device 110 may also be capable of receiving signals from satellites, such as satellite 150, in one or more global navigation satellite systems (GNSS). Wireless device 110 may support one or more radio technologies for wireless communication such as GSM, WCDMA, cdma2000, LTE, 802.11, etc. The terms "radio technology," "radio access technology," "air interface," and "standard" may be used interchangeably.

Wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink may share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE.

Figure 2:
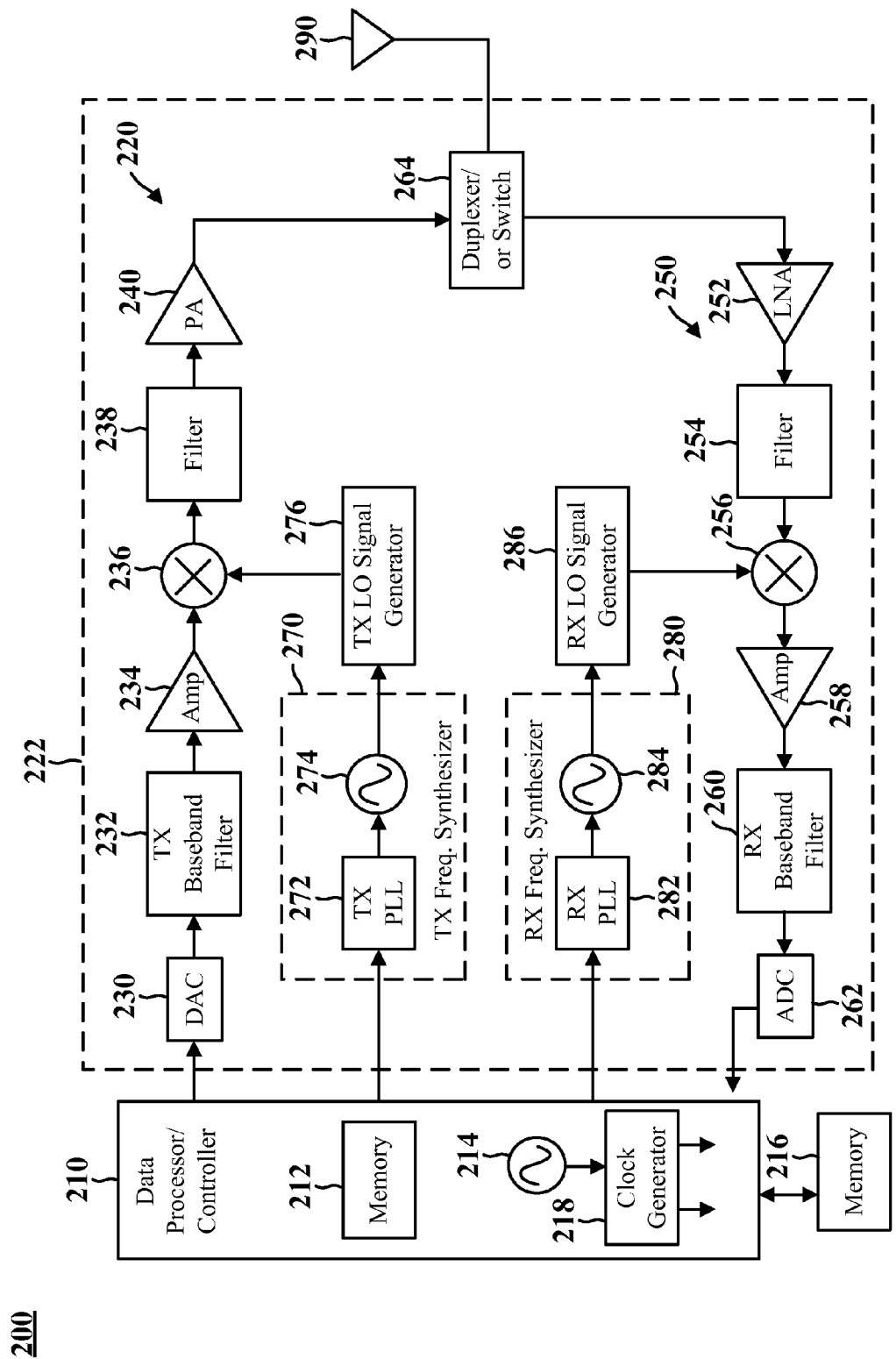
FIG. 2 illustrates an exemplary wireless transceiver employing frequency synthesizers for target frequencies.

FIG. 2 is a block diagram 200 of an exemplary wireless device, such as the wireless device 110. The wireless device includes a data processor/controller 210, a transceiver 222, and an antenna 290. The data processor/controller 210 may be referred to as a processing system. A processing system may include the data processor/controller 210 or both the data processor/controller 210 and the memory 216. The transceiver 222 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 222 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 218 may receive the VCO signal from the oscillator 214 and may generate clock signals for various modules within the data processor/controller 210. The data processor/controller 210 may be implemented on one or more application specific integrated circuits (ASICs) and/or other ICs.

Figure 3:
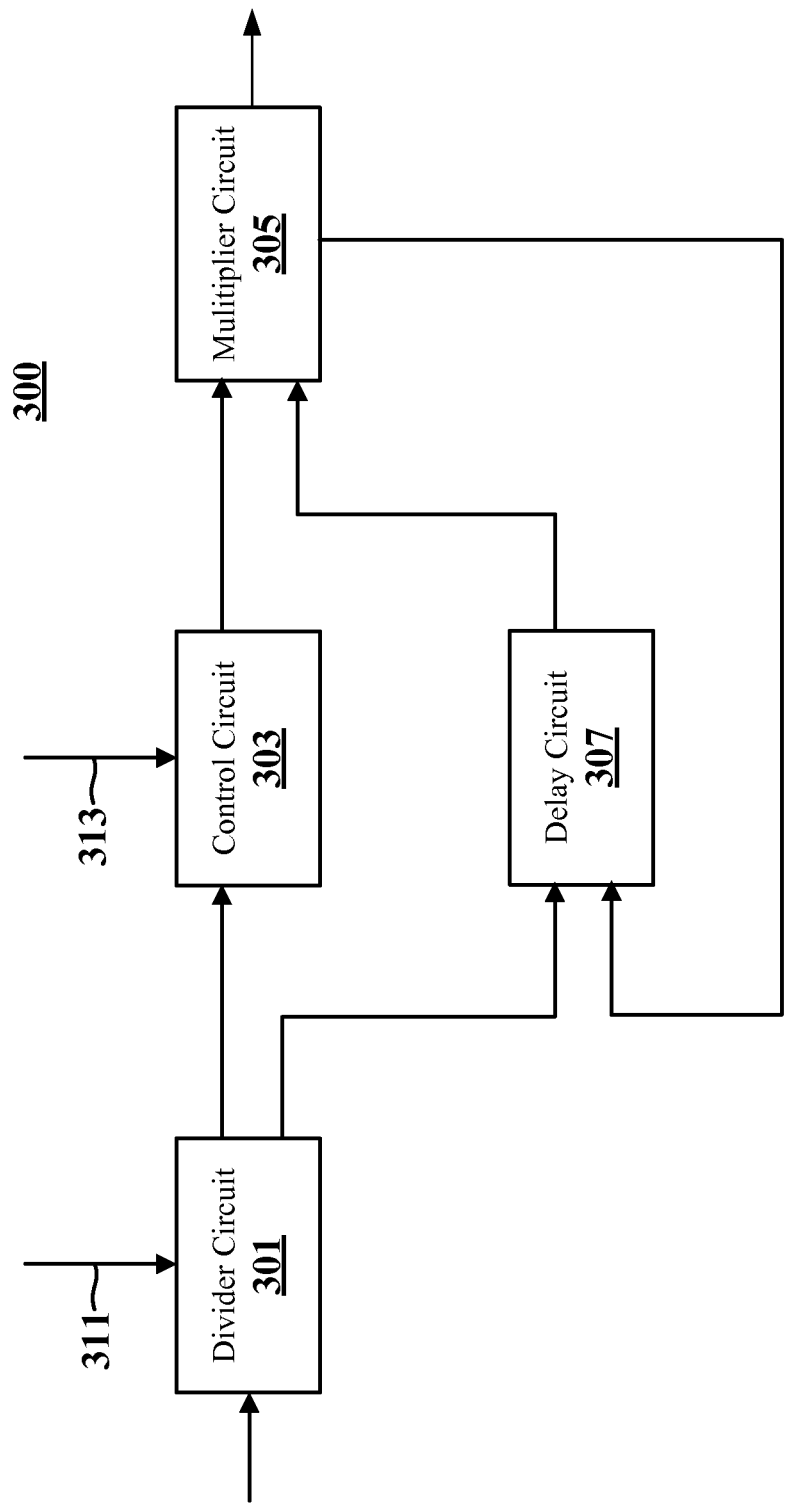
FIG. 3 illustrates an exemplary divider system for an input frequency.

FIG. 3 illustrates an exemplary divider system for an input frequency. Divider system 300 can be used, for example, by TX frequency synthesizer 270 and/or RX frequency synthesizer 280 to produce target frequency signals from received signals from the respective VCOs 274, 284. Divider system 300 can include a divider 301, a control circuit 303, a multiplier circuit 305, and a delay circuit 307. In some embodiments, divider system 300 can include additional logical circuits, such as additional divider and/or multiplier circuits. Divider system 300 can receive an input frequency signal and produce an output signal whose frequency is a fraction of the input signal; the fraction can be determined based on the numerals used in the respective divider circuit 301 and multiplier circuit 305.

Divider circuit 301 can be an integer divider circuit that receives an input frequency signal and a control signal 311 to produce a divided signal for control circuit 303 and delay circuit 307. In some embodiments, divider circuit 301 can receive control signal 311 from processor/controller 210. Divider circuit 301 can be an integer divider, i.e., "divide-by-N" (DIV/N) circuit, where N=1, 2, . . . . In some embodiments, divider circuit 301 is an odd divider (e.g., N=3, 5, 7, 11). Divider circuit 301 can produce a divided signal whose frequency is a fraction of the input frequency ($f_d = f_i / N$).

Multiplier circuit 305 can be an integer multiplier circuit that receives input frequencies from control circuit 303 and/or delay circuit 307 to produce an output frequency that is sent to an external circuit; the output frequency is also sent to delay circuit 307 as part of a feedback loop. Multiplier circuit 305 can be an integer multiplier, i.e., "multiply-by-Y" (×Y) circuit, where Y=1, 2, . . . . In some embodiments, multiplier circuit 305 is an even multiplier (e.g., Y=2, 4, 6, 8). Multiplier circuit 305 can produce a multiplied signal whose frequency is a multiple of the input frequency ($f_o = f_i * Y$).

Delay circuit 307 can be a logical circuit that receives input signals from divider 301 and/or multiplier 305 and produces equivalent delayed signals for multiplier circuit 305. Delay circuit 307 can be used by divider circuit 300 and/or wireless device 200 for phase rotation of the input frequency signal. In some embodiments, as will be discussed in relation to FIG. 4, the input signals from both divider 301 and multiplier 305 are used in a feedback loop between delay circuit 307 and multiplier circuit 305.

Control circuit 303 can be used by divider system 300 to reconfigure the fractional divisor used to modify the frequency of the output signal. Control circuit 303 can include one or more switches to connect outputs of divider circuit 301 to inputs of multiplier circuit 305. In some embodiments, control circuit 303 can receive a divisor control signal 313 from processor/controller 210 to connect the output signal from divider circuit 301, via control circuit 303, to inputs of multiplier circuit 305. In one state, divider system 300 can produce an output signal that comprises the divided signal (i.e., $f_o=f_d=f_i/N$). In the other state, divider system 300 can produce an output signal that is the output of both divider circuit 301 and multiplier circuit 305 (i.e., $f_o=f_i*(Y/N)$).

Figure 4:
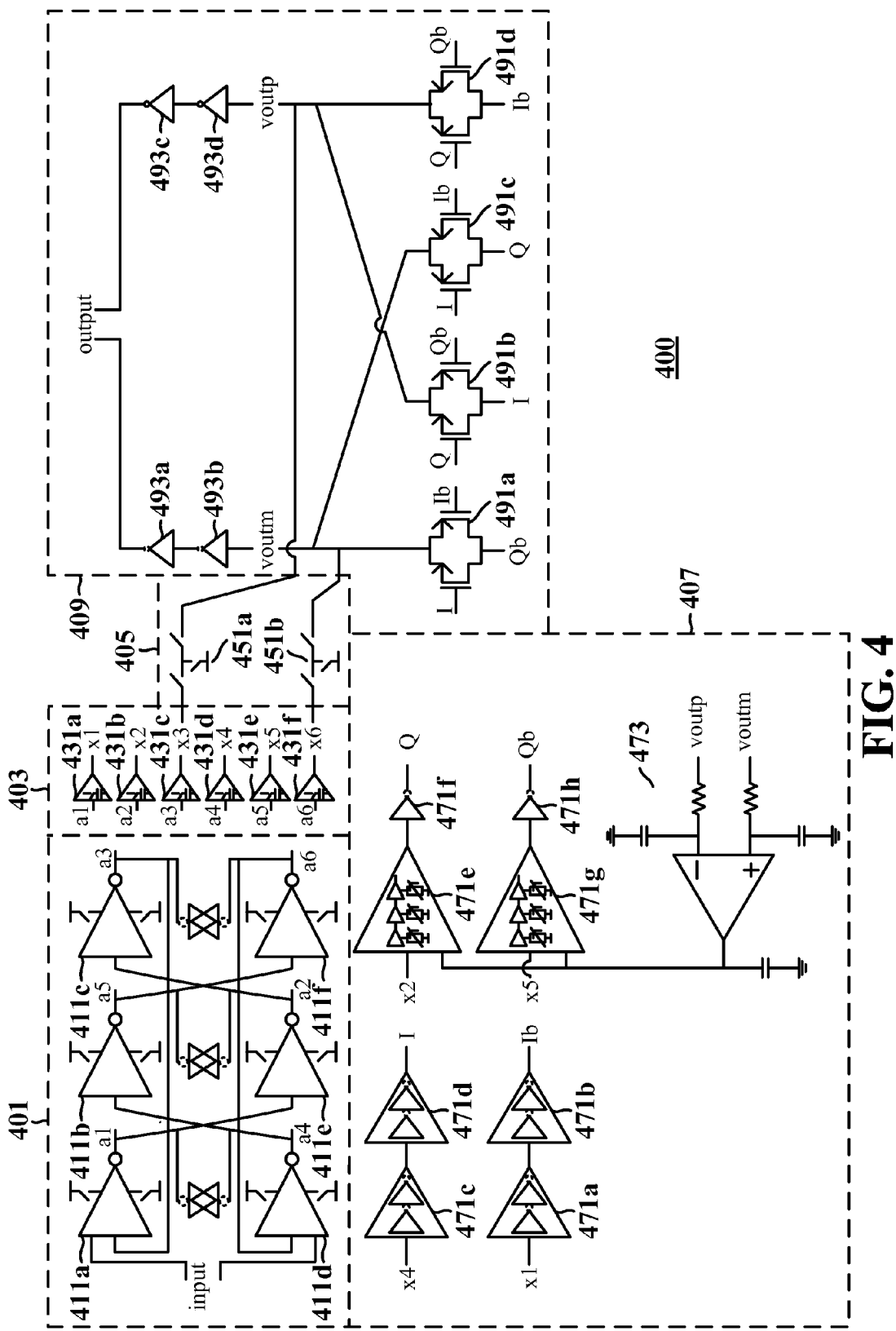
FIG. 4 illustrates an exemplary divider circuit for an input frequency.

FIG. 4 illustrates an exemplary divider circuit for an input frequency.

Divider circuit 400 can be an example circuit implementation of divider system 300 of FIG. 3 and can be used to produce an output signal whose frequency is a fraction of the frequency of a received input signal. Divider circuit 400 can include a divider circuit 401, a buffer circuit 403, a control circuit 405, a delay circuit 407 and a multiplier circuit 409. As will be discussed in further detail below, in the illustrative embodiment, divider circuit 400 is a "divide-by-1.5" circuit, as the divisor is 3/2 from divider circuit 401 comprising a divide-by 3 circuit, multiplier 409 comprising a multiply-by-2 circuit (i.e., a doubler), and switches 451a-b in control circuit 405 being in an "off" position. Other embodiments can use different divider and/or multiplier circuits 401, 409 to produce different divisors (e.g., 5/2, 7/2, 3/4, etc.).

Divider circuit 401 can be a logical circuit that includes one or more logical components to modify an input frequency. In the illustrative embodiment, for example, divider circuit 401 is a divide-by-3 circuit that includes six differential inverters 411a-f connected as three sequential flip-flops to produce a divided output signal. In some embodiments, divider circuit 401 can receive a control signal, e.g., control signal 311 depicted in FIG. 3, to operate switches to enable or disable one or more of inverters 411a-f. Enabling or disabling one or more of inverters 411a-f can alter the divisor used when producing the divided signal. In some embodiments, divider circuit 401 can create an internal feedback loop between its components. For example, in the illustrative embodiment, divider circuit 401 employs a feedback loop between inverters 411a-f, as the outputs of inverters 411c, 411f are used as inputs for inverters 411a, d.

Buffer circuit 403 can buffer the divided signal produced by divider circuit 401 before being transmitted to delay circuit 407 and control circuit 405. In some embodiments, buffer circuit 403 is a component of divider circuit 401. Buffer circuit 403 includes six parallel buffers 431a-f that receive as inputs the a1-a6 outputs from divider circuit 401. Other embodiments may include more or less buffers, with the number of buffers based on the number of outputs from divider circuit 401. Some of buffers 431a-f send their output signals to delay circuit 407, while some of the remaining buffers can send their output signals to control circuit 405.

Control circuit 405 can include switching circuits that are used to modify the overall divisor of divider circuit 400. Control circuit 405 can connect inputs from divider circuit 401 via buffer circuit 403 to multiplier circuit 409. In the illustrative embodiment, for example, control circuit 405 includes two switching circuits 451a-b, that connect to outputs x3 and x6 of buffers 451c, f, while connecting to the output of multiplier circuit 409. Control circuit 405 can receive divisor control signal 313, which can control the state of switches in switching circuits 451a-b. Because switching circuits 451a-b have switches connected to ground, when the switches in switching circuits 451a-b are closed, the output of multiplier circuit is connected to ground. As a result, divider circuit 400 produces an output signal as the divided signal via divider circuit 401 and delay circuit 407; in the illustrative embodiment, for example, the divisor would be 3. When the switches in switching circuits 451a-b are open, the output of divider circuit 400 is the output of multiplier circuit 409; in such instances, the divisor for the illustrative embodiment would be 3/2.

The use of different divisors can alter the required operating range of a VCO that produces the input signal for divider circuit 400. For example, a VCO that uses only a divide-by-3 circuit would need an operating frequency range of 8.44-10.8 GHz to produce divided output frequencies of 525.5-675 MHz. By contrast, a VCO using a reconfigurable divide-by-1.5 or divide-by-3 circuit can use an operating frequency range of 5.42-8.1 GHz to produce divided output frequencies of 451.25-675 MHz. Because the VCO operating range is lower and the output frequency range is larger, more stable or efficient VCOs can be employed, as the range of required output frequencies can be adjusted to lower frequencies.

Delay circuit 407 can include one or more buffers that receive one or more input signals from divider circuit 401 and produce one or more delayed signals. In the illustrative embodiment, for example, delay circuit 407 includes four buffer stages, with each buffer stage including multiple buffers 471a-h. In some embodiments, one or more of buffers 471a-h can be inverters. In the illustrative embodiment, for example, buffers 471f, h are inverters. In some embodiments, buffers 471a-h can include multiple inverters. For example, buffers 471a-d comprise two inverters, while buffers 471e, g include three inverters. In some embodiments, one or more of the inverters are controlled using adjustable resistors. Use of one or more inverters in delay circuit 407 can be used to delay specific input signals relative to others. For example, in the illustrative embodiment, the two buffer stages to produce the Q and $\overline{Q}$ (Qb) component signals each use two more inverters than the buffer stages used to produce the I and $\overline{I}$ (Ib) component signals.

As will be discussed in relation to multiplier circuit 409, delay circuit 407 includes a feedback loop with multiplier circuit 409 via differential amplifier 473. Differential amplifier 473 receives as inputs the differential output signal (in the illustrative embodiment, voutm and voutp) from multiplier circuit 409. The output of differential amplifier 473 is used as an input for one or more buffer stages. In the illustrative embodiment, two of the buffer stages (e.g., buffers 471e, g) receive the feedback signal produced by the differential amplifier as an input.

Multiplier circuit 409 can be a logical circuit that modifies one or more input signals to produce an output signal whose frequency is a multiple of the received signal. In some embodiments, the output signal comprises a differential signal. Multiplier circuit 409 can include switches 491a-d and inverter buffers 493a-d. In the illustrative embodiment, multiplier circuit 409 comprises a multiply-by-2 circuit ("doubler") that sequentially produces an output signal based on I and Q component signals produced by divider circuit 401 via buffer circuit 403 and delay circuit 407. Switches 491a-d each comprise two parallel FET circuits that receive respective positive and negative signals at the gate to produce an output signal. The output of multiplier circuit 409 can be transmitted to other components via inverter buffers 493a-d.

Multiplier circuit 409 can be incorporated into the feedback loop of delay circuit 407, as the output of multiplier circuit 409 is fed back to delay circuit 407 via differential amplifier 473. The incorporation of multiplier 409 into a feedback loop with delay circuit 407 can, for example, stabilize the output signal, as variations or glitches in multiplier circuit 409 do not directly affect the output signal. Further, correlation between individual I and Q component signals can be greater, as feedback from multiple I and Q signals through switches 491a-d raise correlation between each of the I and Q signals.

In some embodiments, each buffer 431a-f can include an adjustable capacitor. In such instances, each adjustable capacitor can be connected via a switch (controlled via control signal 311) to tune the frequency range of the output signal. In some embodiments, the connection/disconnection of the adjustable capacitors can modify the output frequency range at each endpoint. For example, a circuit may have an original operating range of 5.4-8.1 GHz. For example, when the adjustable capacitor is connected, the output frequency can be altered by approximately 20% at each end of the range to have a lower output range of between 4.3 and 8.1 GHz, while the output frequency can have an output range between 5.4 GHz and 9.7 GHz when the adjustable capacitor is not connected. This can result in an overall output frequency range of 4.3-9.7 GHz.

Figure 5:
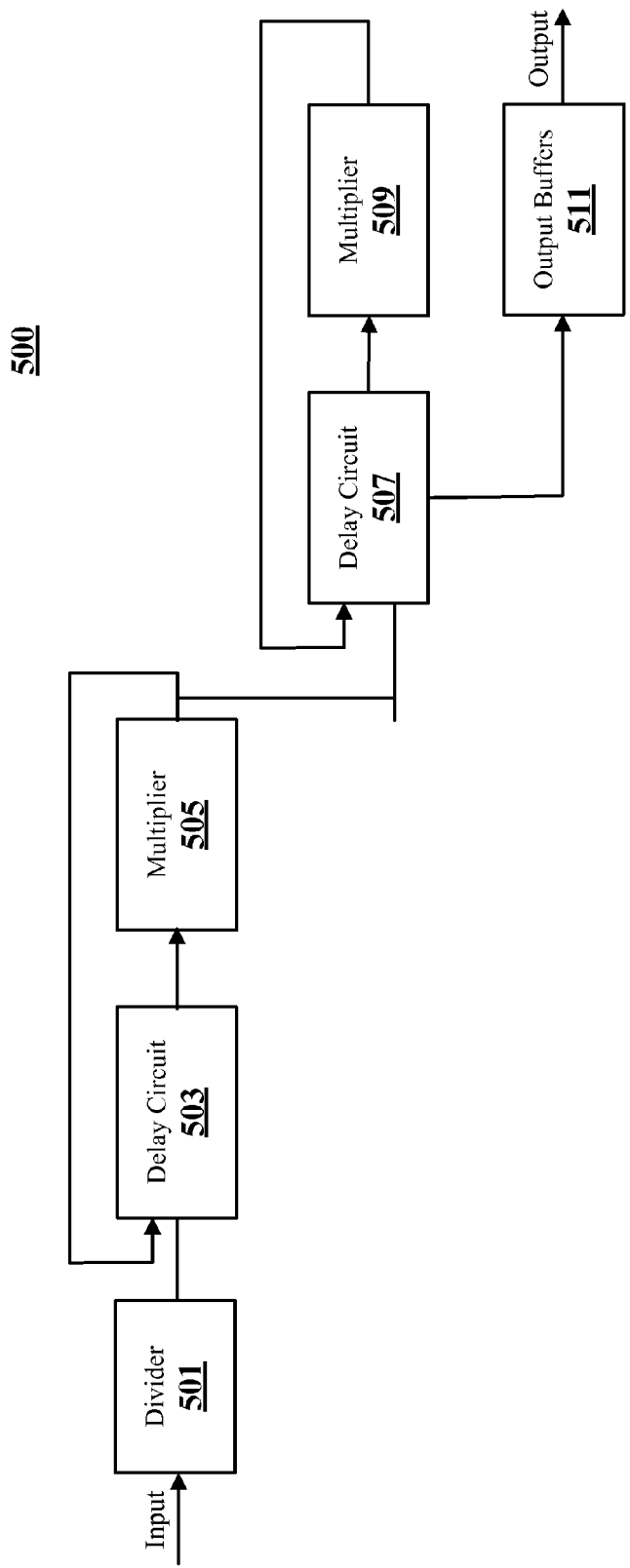
FIG. 5 illustrates another exemplary divider system for quadrature output frequencies.

FIG. 5 illustrates another exemplary divider system for quadrature output frequencies. Divider system 500 can be employed, for example, by TX/RX frequency synthesizers 270, 280 to generate I and Q component signals. Similar to divider system 300, divider system 500 employs an additional multiplier circuit 509 to produce separate I and Q quadrature component signals. Divider system 500 includes a divider circuit 501, delay circuits 503 and 507, multiplier circuits 505 and 509, and output buffer 511. In some embodiments, control circuits can be included before each multiplier circuit 505, 509 to reconfigure the divisor for divider system 500.

Each multiplier circuit 505, 509 is incorporated into a feedback loop with a delay circuit. In the illustrative embodiment, for example, multiplier circuit 505 is in a feedback loop with delay circuit 503, while multiplier circuit 509 is in a feedback loop with delay circuit 507. Similar to the feedback in divider system 300, the feedback loops can stabilize the outputs of respective multiplier circuits 505, 509.

Figure 6:
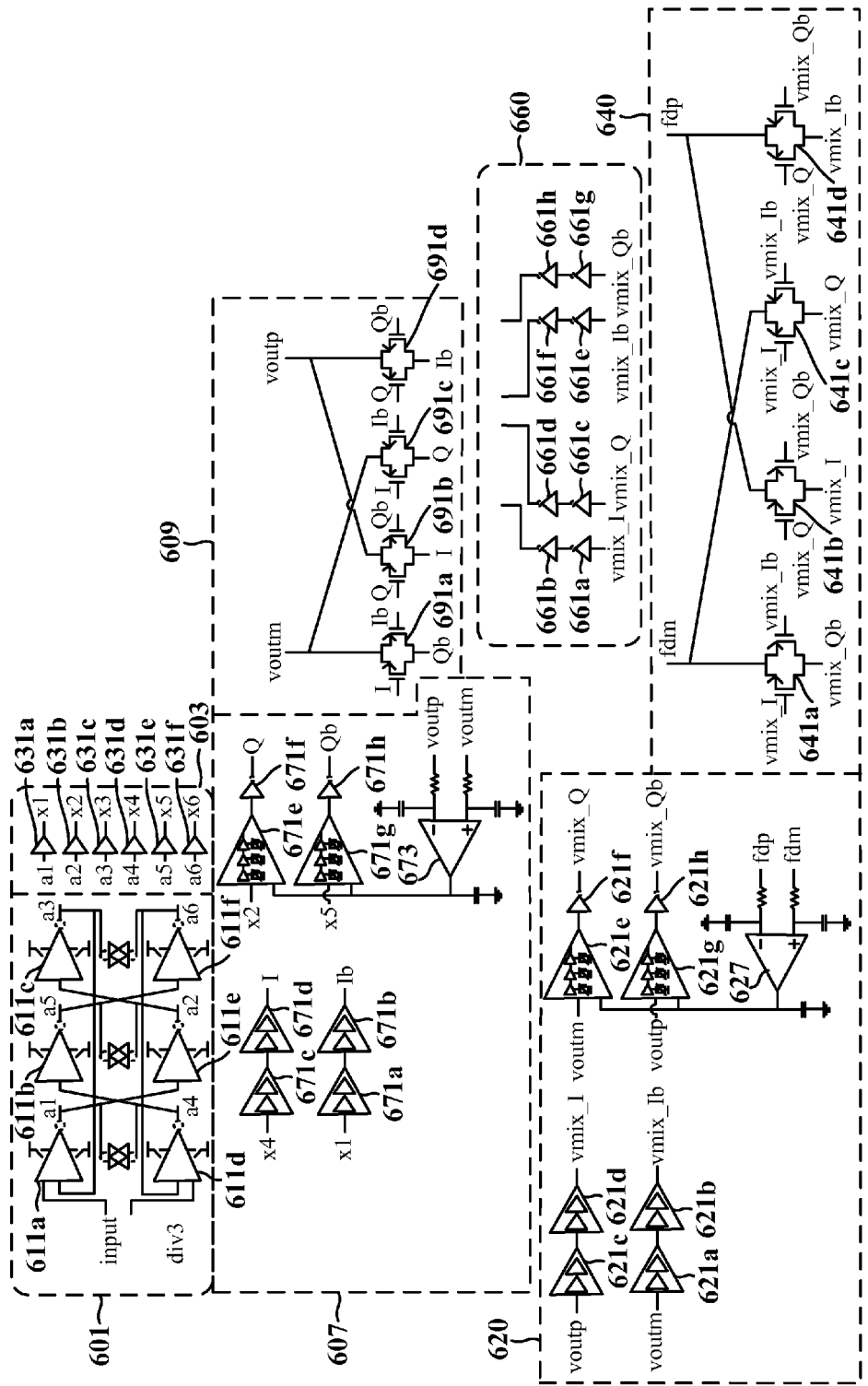
FIG. 6 illustrates an exemplary divider circuit for quadrature output frequencies.

FIG. 6 illustrates an exemplary divider circuit for quadrature output frequencies. Divider circuit 600 can be an example circuit implementation of divider system 500. In the illustrative embodiment, for example, divider circuit 600 is a quadrature divide-by-1.5 circuit that produces I and Q component output signals whose frequency is a fraction of the input frequency signal. Divider circuit 600 can include a divider circuit 601, a buffer circuit 603, a first delay circuit 607, a first multiplier circuit 609, a second delay circuit 620, a second multiplier circuit 640, and an output buffer circuit 660. In some embodiments, divider circuit 600 can also include one or more control circuits to reconfigure the divisor for divider circuit 600.

Divider circuit 601 can correspond to divider circuit 401 and can include inverters 611a-f. In the illustrative embodiment, divider circuit 601 is a divide-by-3 divider and produces multiple output signals for buffer circuit 603. Buffer circuit 603 can correspond to buffer circuit 403 and can include buffers 631a-f for each output of divider circuit 601. In some embodiments, each of buffers 631a-f can include adjustable capacitors to adjust the frequency range of the output signal.

Delay circuit 607 can correspond to delay circuit 407 and can include buffers 671a-h and differential amplifier 673. Multiplier circuit 609 can correspond to multiplier circuit 409 and can include one or more switches 691a-d and can be used to modify one or more input signals it receives. In the illustrative embodiment, for example, multiplier circuit 609 can be a multiply-by-2 circuit and can produce a differential output signal. The differential output signal can be sent back to delay circuit 607 as part of a feedback loop. The differential signal can also be sent to delay circuit 620 as inputs for one or more buffer signals.

Delay circuit 620 can correspond to delay circuit 607 and 407 and can include one or more buffer stages that receive the component signals from the output differential signal from multiplier 609 to produce delayed I and Q signals for multiplier circuit 509. Delay circuit 620 can include buffers 621a-h and differential amplifier 627.

Multiplier circuit 640 can correspond to multiplier circuits 609 and 409 and can include one or more switches 641a-d to produce another differential output signal comprising component signals fdm and fdp. These signals are directly fed back into delay circuit 620 as inputs to differential amplifier 627. In some embodiments, multiplier 640 can act as a passive mixer for the I and Q component signals. In the illustrative embodiment, multiplier circuit 640 is used as a quadrature delay control to delay the output of the component Q signals. In such instances, multiplier circuit 609 eliminates the need for an external component to delay Q component signals by 90° relative to the I component signals. Output buffer circuit 660 includes inverters 661a-h and can be used to delay the output I and Q component signals produced by delay circuit 620.

Divider circuit 600 can include three controlled feedback loops: an internal feedback loop in divider circuit 501, 601, a feedback loop for delay circuit 503, 607 and multiplier 505, 609, and a feedback loop for delay circuit 507, 620 and multiplier circuit 509, 640.

Figure 7A:
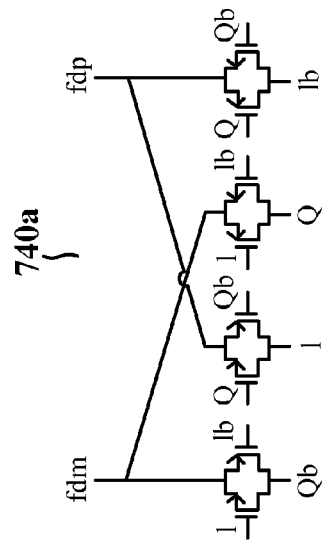
FIG. 7A illustrates an exemplary multiplier circuit in the divider system for a multiply-by-2 circuit.
Figure 7A:
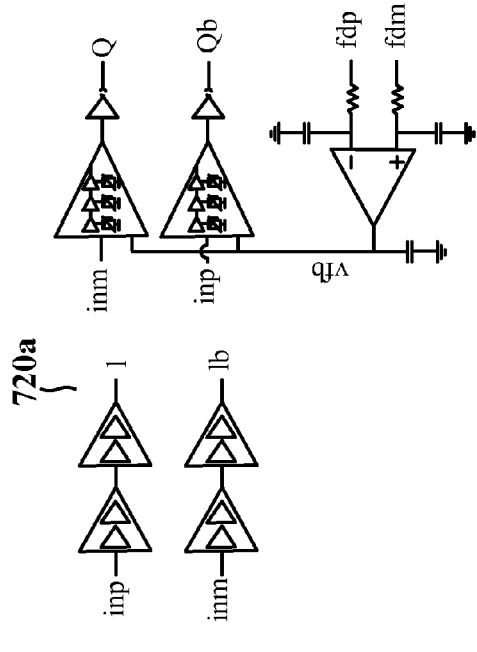
Figure 7B:
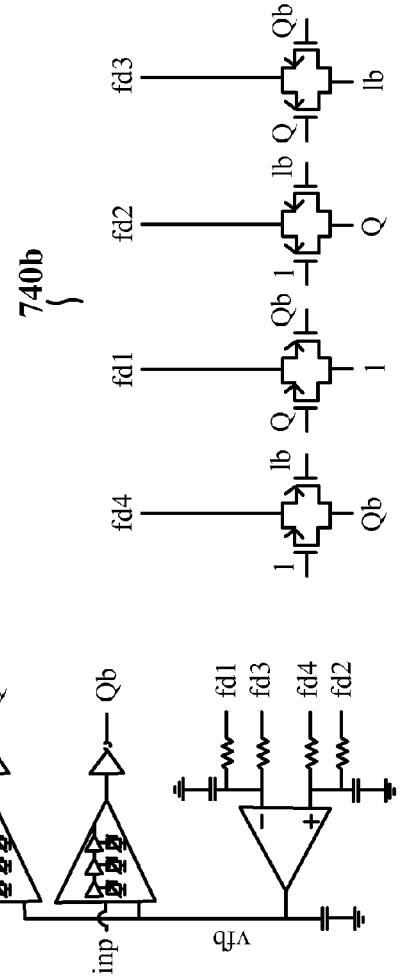
FIG. 7B illustrates another exemplary multiplier circuit in the divider system.

FIG. 7A illustrates an exemplary multiplier circuit in the divider system for a multiply-by-2 circuit. FIG. 7B illustrates another exemplary multiplier circuit in the divider system. Divider circuit 600 can employ delay circuit 720a and multiplier circuit 740a when using multiplier circuit 609 or 640 as a multiply-by-2 circuit. In some embodiments, divider circuit 600 can employ delay circuit 720b and multiplier circuit 740b when using multiplier circuit 609 or 640 as a delay circuit. Multiplier 609 or 640 can be employed as a delay circuit when an input frequency does not need to be multiplied. In such instances, multiplier 609 and/or 640 can be configured to produce an output frequency that has the same frequency as the input. In such instances, multiplier circuit 740b incorporates all output signals into the feedback loop by sending all output signals to the differential amplifier in delay circuit 720b.

Figure 8:
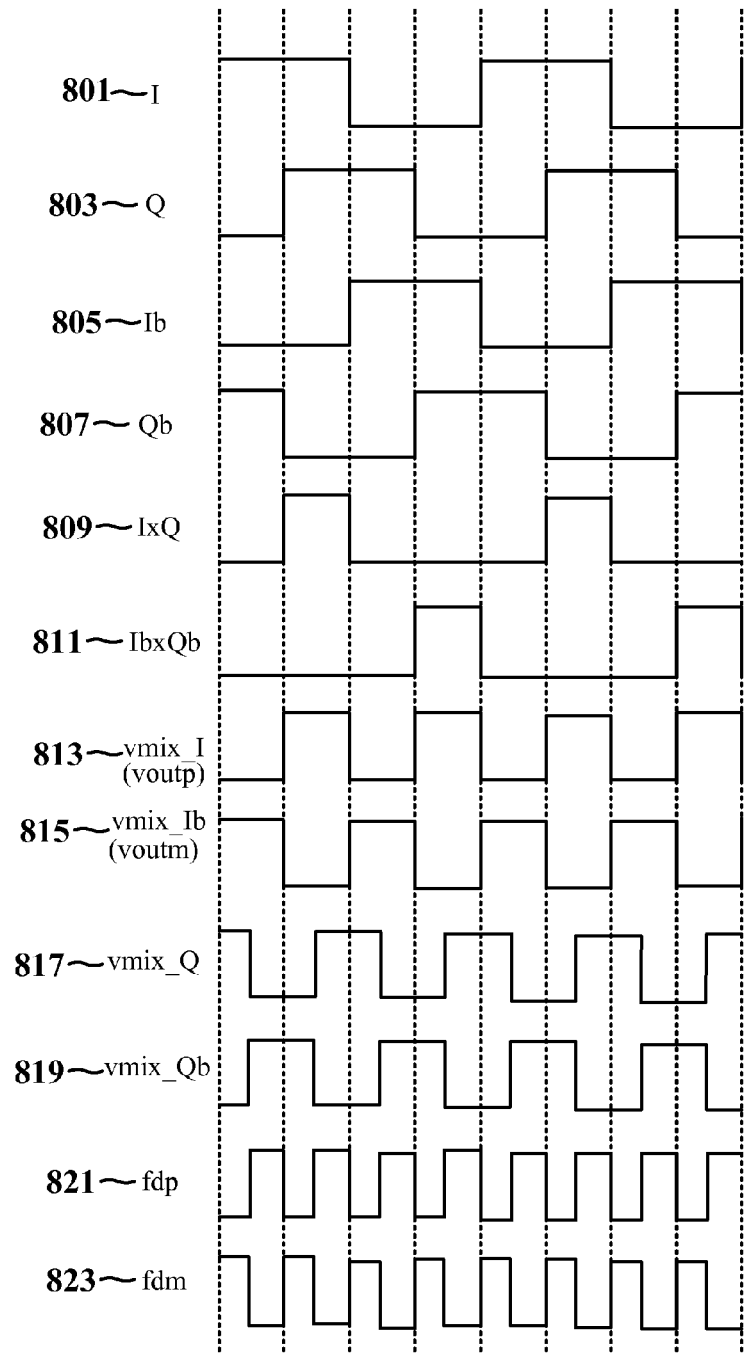
FIG. 8 illustrates timing diagrams for various stages of the divider circuit.

FIG. 8 illustrates timing diagrams for various stages of the divider circuit. Timing diagram 800 illustrates the signals for various signals in divider circuit 600. Timing diagram includes I signal 801, Q signal 803, $\bar{I}$ (Ib) signal 805, $\bar{Q}$ (Qb) signal 807, mixed I and $\bar{I}$ signals (I×Q) 809, mixed $\bar{I}\times\bar{Q}$ (Ib×Qb) signals 811, mixed I component (vmix_I, voutp) signal 813, mixed $\bar{I}$ component (vmix_Ib, voutm) signal 815, mixed Q component (vmix_Q) signal 817, mixed $\bar{Q}$ component (vmix_Qb) signal 819, fdp signal 821, and fdm signal 823.

As can be seen by signals 813-819 corresponding to the output signals of output buffer 660, signals 813-819 have twice the frequency of the I and Q component signals 801, 803 output from divide-by-3 circuit 601 and delay circuit 607. Signals 813-819 have 2/3 the frequency of the input signal into divider circuit 601. Even though the second multiplier 640 doubled its output frequency, its feedback into delay circuit 620 prevented multiplier circuit 640 modifying the frequency of output signals 813-819.

Figure 9:
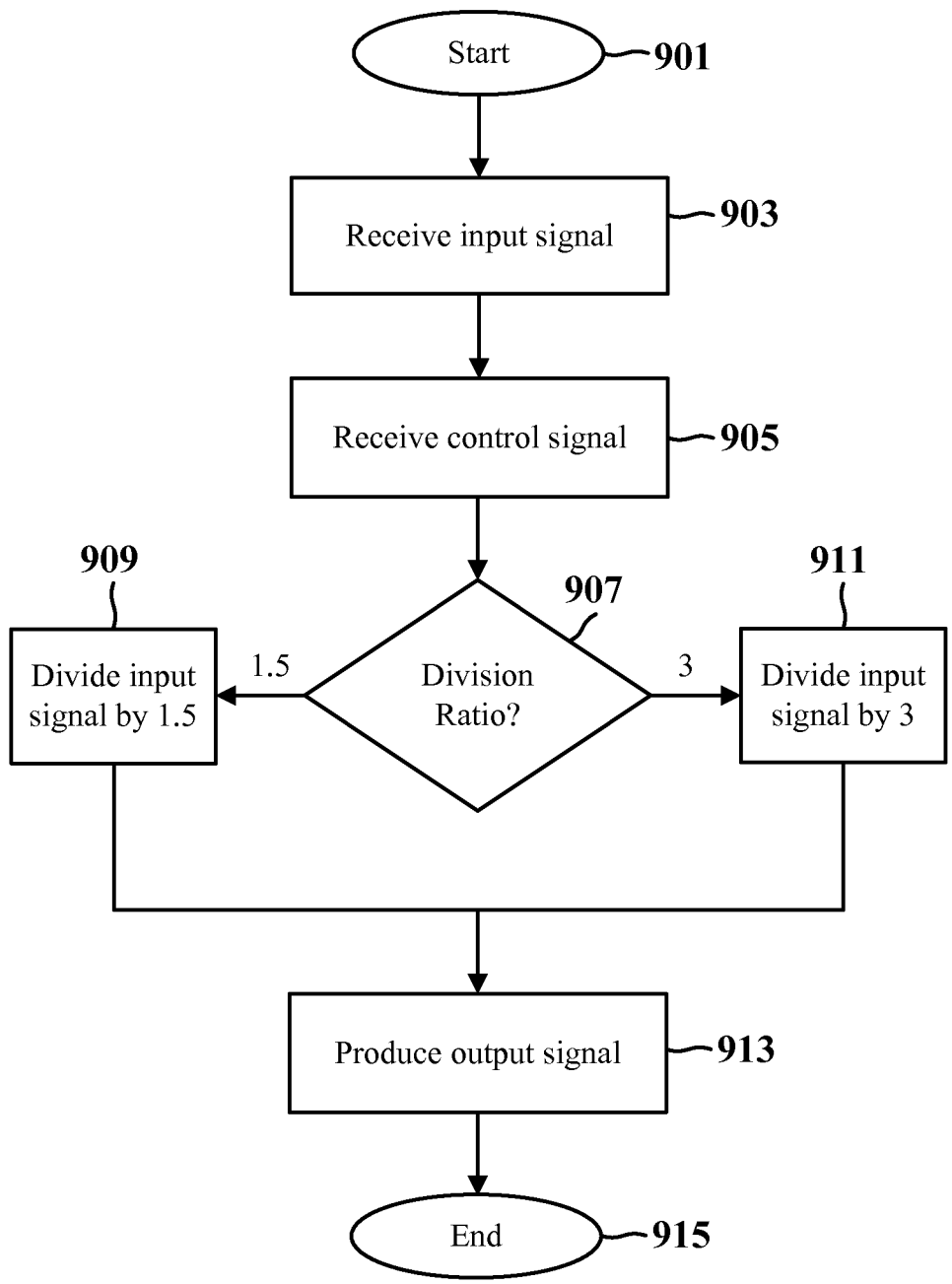
FIG. 9 illustrates an exemplary method for producing an output frequency using the frequency divider.

FIG. 9 illustrates an exemplary method for producing an output frequency using the frequency divider. A frequency synthesizer 270, 280 can employ method 900, for example, when configuring a divisor to generate a target frequency. Method 900 can begin at step 901 and proceed to step 903, where it receives an input signal. For example, divider circuit 400 can receive an input signal from VCO 274, 284.

In step 905, one or more components in a divider circuit can receive control signals. For example, a buffer circuit 403 can receive control signals to activate adjustable capacitors to modify the output frequency range of divider circuit 400. Similarly, control circuit 405 can receive divisor control signals 313 to reconfigure the divisor of divider circuit 400 by including or excluding multiplier circuit 409.

In step 907, the divider circuit can determine what division ratio to use. For example, control circuit 405 can receive a divisor control signal. Control circuit 405 can determine the desired division ratio, for example, by controlling the state of switches connected to the output of multiplier 409. In the illustrative embodiment, for example, when control circuit 405 receives a divisor control signal 313 that indicates that the divisor should be 1.5, it proceeds to step 909, where switches 451a-b remain open and the output of multiplier circuit 609 is not connected to ground. In such instances, multiplier circuit 409 can be included in a feedback loop with a delay circuit 407 to produce a stabilized output signal.

Alternatively, when control circuit 405 receives a divisor control signal 313 that indicates that the divisor should be 3, it proceeds to step 911, where switches 451a-b are closed and the output of multiplier circuit 409 is connected to ground. In such instances, delay circuit 407 produces an output signal that is stabilized due to a feedback loop through delay circuit 407.

In step 913, the divider produces an output signal that has a frequency based on the determined division ratio in step 907. For example, the output signal can either include or exclude the signal as multiplied by multiplier circuit 409. The output signal produced in step 913 is stabilized through at least two feedback loops, as divider circuit 401 includes a feedback loop and delay circuit 407 through multiplier circuit 409 also includes a feedback loop. Once the output signal is produced, method 900 can end at step 915.

Therefore, the aspects herein disclose an improved frequency divider for use in electronic hardware. Incorporating cascading divider and/or multiplier blocks into a feedback control loop enables more stable output signals without adding complex feedback equipment. Further, incorporation of divider and/or multiplier blocks enables a stable quadrature output signal without an additional, external delay circuit for the Q component signal. Additions such as adjustable capacitors and re-adjustable divisor ratios enable a wider frequency tuning range for a frequency synthesizer.

It is understood that the specific order or hierarchy of steps in the processes/flow charts disclosed is an illustration of exemplary approaches. Based upon design preferences, it is understood that the specific order or hierarchy of steps in the processes/flow charts may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A reconfigurable frequency divider comprising:
   a frequency divider configured to receive an input signal;
   a delay circuit configured to receive a divided signal produced by the frequency divider;
   a frequency multiplier configured to produce an output signal based on a delayed signal produced by the delay circuit, wherein the delay circuit receives the output signal; and
   a buffer circuit between outputs of the frequency divider and inputs of the delay circuit and the frequency multiplier.

2. The divider of claim 1, further comprising:
   a control circuit configured to select a division ratio of the output signal based on a control input, the division ratio defined by at least one of the frequency divider or the frequency multiplier.

3. The divider of claim 2, wherein the control circuit is connected between the frequency divider and the frequency multiplier.

4. The divider of claim 1, wherein the frequency divider comprises a divide-by-3 circuit.

5. The divider of claim 1, wherein the frequency multiplier comprises a multiply-by-2 circuit.

6. The divider of claim 1, wherein the buffer circuit is configured to adjust a frequency of the output signal.

7. The divider of claim 6, wherein the buffer circuit further comprises a plurality of adjustable capacitors, the plurality of adjustable capacitors comprising:
   an adjustable capacitor between each output of the frequency divider and each input of the delay circuit; and
   an adjustable capacitor between each output of the frequency divider and each input of the frequency multiplier.

8. The divider of claim 7, wherein the plurality of adjustable capacitors adjusts the frequency of the output signal.

9. The divider of claim 1, wherein the output signal comprises:
   a quadrature signal comprising:
      an I composite signal, and
      a Q composite signal.

10. The divider of claim 6, further comprising:
   a second delay circuit configured to receive the outputs of the frequency multiplier;
   a second frequency multiplier configured to:
      receive a second delayed signal produced by the second delay circuit, and
      produce a multiplied signal to the delay circuit; and
   an output buffer circuit configured to:
      receive a third delayed signal from the delay circuit and produce a second output signal.

11. A method of producing an output signal, comprising:
   receiving, by a frequency divider, an input signal;
   receiving, by a delay circuit:
      a divided signal produced by the frequency divider, and
      the output signal;
   receiving, by a frequency multiplier, a delayed signal produced by the delay circuit; and
   producing, by the frequency multiplier, the output signal;
   receiving, by a buffer circuit, the divided signal;
   sending, by the buffer circuit, a buffered signal to:
      inputs of the delay circuit, and
      inputs of the frequency multiplier.

12. The method of claim 11, further comprising:
   receiving a control signal from a control circuit, wherein the control circuit selects a division ratio based on a control input, the division ratio defined at least by one of the frequency divider or the frequency multiplier.

13. The method of claim 12, wherein the control circuit is connected between the frequency divider and the frequency multiplier.

14. The method of claim 12, wherein the frequency divider comprises a divide-by-3 circuit.

15. The method of claim 12, wherein the frequency multiplier comprises a multiply-by-2 circuit.

16. The method of claim 11, further comprising:
   adjusting, by the buffer circuit, a frequency of the output signal.

17. The method of claim 16, wherein the buffer circuit further comprises a plurality of adjustable capacitors, the plurality of adjustable capacitors comprising:
   an adjustable capacitor between each output of the frequency divider and each input of the delay circuit; and
   an adjustable capacitor between each output of the frequency divider and each input of the frequency multiplier.

18. The method of claim 17, further comprising:
   adjusting, by the plurality of adjustable capacitors, the frequency of the output signal.

19. The method of claim 11, wherein the output signal comprises:
   a quadrature signal comprising:
      an I composite signal, and
      a Q composite signal.

20. The method of claim 16, further comprising:
   receiving, by a second delay circuit, the output of the frequency multiplier;
   receiving, by a second frequency multiplier, a second delayed signal produced by the second delay circuit;
   producing, by the second frequency multiplier, a multiplied signal to the delay circuit;
   receiving, by an output buffer circuit, a third delayed signal from the delay circuit; and
   producing, by the output buffer circuit, a second output signal.

* * * * *